(12) United States Patent
Jouffre et al.

(10) Patent No.: US 6,249,154 B1
(45) Date of Patent: Jun. 19, 2001

(54) PROCESS OF CONTROLLING A SWITCH OF A SWITCHED-CAPACITANCE DEVICE, AND CORRESPONDING SWITCHED-CAPACITANCE DEVICE

(75) Inventors: Pierre-Olivier Jouffre; Isabelle Telliez, both of Grenoble; Frédéric Paillardet, Aix les Bains, all of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/571,392

(22) Filed: May 15, 2000

(30) Foreign Application Priority Data

May 20, 1999 (FR) .................................................. 99 06424

(51) Int. Cl.[7] .................................................. G11C 27/02
(52) U.S. Cl. .............................................. 327/91; 327/337
(58) Field of Search .................................. 327/90, 91, 93, 327/94, 337, 383, 384, 389, 390; 341/122

(56) References Cited

U.S. PATENT DOCUMENTS

| 5,084,634 | 1/1992 | Gorecki et al. ........................ 307/352 |
| 5,572,154 | * 11/1996 | Rakers et al. .......................... 327/91 |
| 5,872,469 | * 2/1999 | Nestler ................................ 327/390 |
| 6,060,913 | * 5/2000 | Vulih et al. ............................ 327/94 |
| 6,060,914 | * 5/2000 | Nunokawa .............................. 327/91 |

FOREIGN PATENT DOCUMENTS

| 0 875 904 A2 | 11/1998 | (EP) .............................. G11C/27/02 |
| 95/32506 | 11/1995 | (WO) ............................. G11C/27/02 |

* cited by examiner

Primary Examiner—My-Trang Nu Ton
(74) Attorney, Agent, or Firm—Theodore E. Galanthay; Allen, Dyer, Doppelt, Milbrath & Gilchrist, P.A.

(57) ABSTRACT

With a switch including at least one insulated-gate field-effect transistor, an analog input signal is delivered on the source of the transistor and the transistor is controlled on its gate synchronized with a clock signal to successively turn it on and off. On the conclusion of each half-period of the clock signal during which the transistor is off, a precharging capacitor is precharged at the start of the next half-period and for a predetermined precharge duration, with a predetermined precharge voltage. Then, for the remaining duration of the half-period, the precharged capacitor is connected between the source and the gate of the transistor to turn it on under the action of a gate-source voltage which is almost independent of the level of the input signal. At the end of the half-period, the gate of the transistor and the precharging capacitor are grounded.

29 Claims, 5 Drawing Sheets

PROCESS OF CONTROLLING A SWITCH OF A SWITCHED-CAPACITANCE DEVICE, AND CORRESPONDING SWITCHED-CAPACITANCE DEVICE

FIELD OF THE INVENTION

The invention relates to switches, and, more particularly, to insulated-gate field-effect transistors (MOS transistors) of analog/digital (A/D) converters.

BACKGROUND OF THE INVENTION

An analog MOS switch, i.e. a MOS switch intended to transmit analog signals, generally functions by successively turning the MOS transistor on and off by biasing it sufficiently such that its drain-source resistance in the on state (commonly termed $R_{on}$ by those skilled in the art) is small in relation to the load capacitance (switched capacitance) connected on its drain, and to the frequency of the analog signal to be transmitted. In order for a MOS transistor to be on, it is necessary as a minimum for the gate-source voltage difference to exceed the threshold Vt of the transistor. Consequently, the analog signal to be transmitted cannot exceed the system supply voltage minus this threshold voltage. Moreover, because the analog input voltage modulates the gate-source voltage of the transistor, the resistance $R_{on}$ varies with the level, i.e. the amplitude, of the signal.

Although this variation is only slightly troublesome at low frequencies, it very quickly becomes disturbing and generates distortions at higher frequencies, for example at frequencies of the order of 100 MHZ, especially for high resolution, for example 10 bits in an analog/digital (A/D) converter application, with this elevated frequency. Stated otherwise, the distortion, caused by the variation in resistance $R_{on}$, is manifested as nonlinear restoration of the signal by the switch, in terms of amplitude and phase. Additionally, the larger the amplitude of the input signal, the larger this distortion since the resistance $R_{on}$ is inversely proportional to the level of the input signal.

An approach which has already been envisaged includes controlling the switch digitally, i.e. with a logic signal exhibiting a high level and a low level, and by using a particularly elevated high level, for example of the order of twice the supply voltage. This makes it possible to minimize the variations in the level of the input signal, but such a solution is not applicable to the technologies currently envisaged in microelectronics, such as 0.25 micron or 0.18 micron, or even more miniaturized technologies.

Dimensioning approaches may also be envisaged to decrease the product $R_{on} \times C1$, where C1 denotes the capacitive value of the load capacitance. However, in most cases, C is imposed by other design constraints, such as noise and consumption, thereby leading to the need to decrease $R_{on}$. However, decreasing this resistance amounts to increasing the size of the transistor forming the switch, and hence to increasing in particular the stray capacitance of the device.

SUMMARY OF THE INVENTION

An object of the invention is to minimize, or even to almost completely eliminate, the distortions of a high-frequency analog signal transmitted through a switch, without increasing the size of the transistor, and in a manner which is entirely compatible with 0.25 micron or 0.18 micron, or even more miniaturized fabrication technology.

The invention therefore provides a process for controlling a switch of a switched-capacitance device, this switch comprising at least one insulated-gate field-effect transistor, for example an N-channel MOS transistor. According to this process, an analog input signal is delivered on the source of the transistor and the transistor is controlled on its gate synchronized with a clock signal so as to successfully turn it on and off.

According to a general characteristic of the invention, on the conclusion of each half-period of the clock signal during which the transistor is off, a precharging capacitor is precharged at the start of the next half-period (termed the conduction half-period) and for a predetermined precharge duration, with a predetermined precharge voltage, then for the remaining duration of the conduction half-period. The precharged capacitor is connected between the source and the gate of the transistor forming the switch so as to turn it on under the action of a gate-source voltage which is almost independent of the level of the input signal. Then, at the end of the half-period, the gate of the transistor and the precharging capacitor are grounded.

Stated otherwise, the MOS transistor of the switch is not controlled digitally, i.e. with a control logic signal having a high state (for example the supply voltage Vdd) and a low state (for example ground), but by using a floating gate-source control voltage which is almost independent of the voltage of the input signal. This floating voltage is obtained by connecting between the gate and the source of the MOS transistor, a capacitor previously precharged with a predetermined precharge voltage.

The person skilled in the art will be able to tailor the precharge duration of the precharging capacitor, and consequently the remaining duration of the conduction half-period as a function of the sought-after effectiveness, given the application envisaged. Indeed, the switched-capacitance device should be steady over a sufficient duration (upon the half-period during which the switch is on) such that the device may be regarded as static in relation to the product $R_{on}C1$, where C1 denotes the capacitive value of the load capacitance (switched capacitance) connected at the output of the switch. By way of indication, the higher the transmission frequency and the larger the sought-after resolution, the longer the remaining half-duration of the conduction half-period will have to be.

In this respect it has been observed that a remaining duration of the conduction half-period at least equal to 1.5 times the time constant $R_{on}C1$ of the resistive capacitive circuit formed by the drain-source resistance of the transistor in its on state and by the switched capacitance, constituted a minimum below which the effectiveness sought by the invention greatly decreased. Furthermore, it has been deemed preferable for this remaining duration of the conduction half-period to be at least equal to three or four times the time constant. This makes it possible in particular to obtain satisfactory results with an input signal frequency of the order of a few hundred MHz and a resolution of the order of from 10 to 12 bits, and with a clock signal having a frequency of 50 MHz, a frequency corresponding to the sampling frequency of the analog/digital converter.

Moreover, on the conclusion of the precharge duration, when the precharging capacitor is connected floating between the source and the gate of the transistor of the switch, the gate-source voltage is equal to the precharge voltage in the case where the system is devoid of global stray capacitance.

This being so, in practice, this global stray capacitance exists and is more particularly formed by the gate-source capacitance of the transistor and by the stray capacitance existing between ground and the terminal common to the precharging capacitor and to the gate of the transistor of the switch. This global stray capacitance has the consequence, during redistribution of the charges on conclusion of the precharge duration, of leading to a gate-source voltage of the transistor which is below the precharge voltage.

The person skilled in the art will be able to tailor the value of the precharge voltage in such a way that the gate-source voltage during toggling on the conclusion of the precharge duration remains greater than the threshold voltage of the transistor forming the switch (so that it is on) given the value of the stray capacitance and of the gate-source capacitance of the transistor. In practice, it will advantageously be possible to choose a precharge voltage at least equal to twice the threshold voltage of the transistor.

The process according to the invention applies equally well in a variant in which the switched-capacitance device comprises only one input for receiving the input signal, as in a variant using a differential mode, i.e. in which the input signal has a direct component and a complemented component which is symmetrical with respect to a common-mode voltage. More precisely, in the variant with a single input, for the precharge duration, a first terminal of the precharging capacitor is connected to the precharge voltage and to the gate of the transistor forming the switch and a second terminal of the precharging capacitor is earthed. And, on conclusion of the precharge duration, i.e. for the remaining duration of the conductor half-period, the second terminal of the precharging capacitor is disconnected from ground and is connected to the source of the transistor, and the first terminal of the precharging capacitor is disconnected from the precharge voltage.

In this implementation variant with single input, it is again preferable, still with the objective of further minimizing the variations in the input signal on the gate-source voltage of the transistor, to choose a precharging capacitor whose capacitive value is much greater, for example two to three times greater, than the sum of the stray capacitance and of the gate-source capacitance of the transistor forming the switch. Indeed, if this were not the case, there would be a capacitive divider bridge causing gate-source voltage variations due to the variations in the input signal and consequently possible distortions, which may prove to be troublesome in certain applications.

The implementational variant using the differential mode is in this respect particularly advantageous since it is possible to completely compensate for this stray capacitive effect during the redistribution of the charges, by modulating the precharge voltage via the complemented input of the input signal. More precisely, in such a mode of implementation, the switch then comprises two insulated-gate field-effect transistors whose sources are linked together and whose gates are linked together. Advantageously, the direct component of the input signal is then delivered on the source of each transistor. Furthermore, during the precharge duration the first terminal of the precharging capacitor is connected to a supply voltage as well as to the gate of each transistor of the switch and the complemented component is delivered to a second terminal of the precharging capacitor. On conclusion of the precharge duration, i.e. conduction for the remaining duration of the conduction half-period, the second terminal of the precharging capacitor is disconnected from the complemented component and is linked to the source of each transistor of the switch. The first terminal of the precharging capacitor is disconnected from the supply voltage. Finally, in order to completely eliminate this stray capacitive effect during redistribution of the charges, the capacitive value of the precharging capacitor is advantageously taken equal to the sum of the capacitive value of the gate-source capacitance of each transistor of the switch and of the capacitive value of the stray capacitance existing between the second terminal of the precharging capacitor and ground.

This being so, once the redistribution of the charges has been performed on conclusion of the precharge duration, there remains all the same, in the variant with single input or in the differential variant, a stray modulation of the gate-source voltage by the input signal, by reason of the stray capacitance mentioned hereinabove. This modulation is however second order and it remains very small since the stray capacitance, which is mainly a technological routing capacitance, in practice remains very small in relation to the sum of the capacitive value of the precharging capacitor and of the capacitive value of the gate-source capacitance of the transistor.

The subject of the invention is also a switched-capacitances device, comprising at least one input terminal receiving an analog input signal, a switch comprising at least one insulated-gate field-effect transistor whose source is linked to the input terminal, a load capacitance connected to the drain of the transistor, and control means able to control the transistor on its gate in tempo with a clock signal so as to turn it successively on and off.

According to a general characteristic of the invention, the control means comprise a precharging capacitor and precharge means able, on conclusion of each half-period of the clock signal during which the transistor is off, to precharge the precharging capacitor at the start of the next half-period (termed the conduction half-period) and for a predetermined precharge duration, with a predetermined precharge voltage. The control means also comprise first connection means able, for the remaining duration of the conduction half-period, to connect the precharged capacitor between the source and the gate of the transistor of the switch so as to turn it on under the action of a gate-source voltage which is almost independent of the level of the input signal. The control means also comprise second connection means able, at the end of the conduction half-period, to ground the gate of the transistor and the precharging capacitor.

According to one embodiment of the invention, in which the device comprises just a single input terminal receiving the input signal, the precharge means comprise a first circuit breaker connected between, on the one hand, a supply terminal linked to a supply voltage and, on the other hand, a first terminal of the precharging capacitor, which terminal is linked to the gate of the transistor. A second circuit breaker is connected between ground and a second terminal of the precharging capacitor, a third circuit breaker is connected between the second terminal of the precharging capacitor and the source of the transistor, and a fourth circuit breaker is connected between the gate of the transistor and ground. Also, first drive means are able to close the first and second circuit breakers and to open the third and fourth circuit breakers for the precharge duration.

The first connection means advantageously comprise the third circuit breaker and second drive means able to open the first, second and fourth circuit breakers and to close the third circuit breaker for the remaining duration of the conduction half-period. Lastly, the second connection means comprise the fourth circuit breaker and third drive means able to close the fourth circuit breaker at the end of the conduction half-period. The various circuit breakers are advantageously embodied by MOS transistors and the various drive means, which have been defined here in a functional manner, are for example embodied in the form of logic gates in a conventional manner by logic synthesis means.

In an embodiment of the differential type, i.e. in which the input signal comprises a direct component and a complemented component which are symmetrical with respect to a common-mode voltage, the device advantageously comprises a first input terminal receiving the direct component of the input signal and a second input terminal receiving the complemented component of the input signal. The switch comprises two insulated-gate field-effect transistors whose sources are together linked to the first input terminal and whose gates are linked together.

The precharge means comprise a first circuit breaker connected between, on the one hand, a first supply terminal linked to a supply voltage and, on the other hand, a first terminal of the precharging capacitor, which terminal is linked to the gate of each transistor. A second circuit breaker is connected between the second input terminal receiving the complemented component of the input signal and a second terminal of the precharging capacitor, a third circuit breaker is connected between the second terminal of the precharging capacitor and the source of each transistor, and a fourth circuit breaker is connected between the gate of each transistor and ground. Also, first drive means are able to close the first and second circuit breakers and to open the third and fourth circuit breakers for the precharge duration.

The first connection means comprise the third circuit breaker and second drive means able to open the first, second and fourth circuit breakers and to close the third circuit breaker for the remaining duration of the half-period. The second connection means comprise the fourth circuit breaker and third drive means able to close the fourth circuit breaker at the end of the half-period. The capacitive value of the precharging capacitor is then taken equal to the sum of the capacitive value of the gate-source capacitance of each transistor and of the capacitive value of the stray capacitance existing between the first terminal of the precharging capacitor and ground.

The person skilled in the art is aware that on traversing a MOS transistor, a voltage drop equal to the threshold voltage of this transistor occurs. Also, the precharge voltage of the precharging capacitor undergoes this voltage drop with respect to the voltage applied upstream of the first circuit breaker. This being so, it is particularly advantageous in certain cases to be able to precharge the precharging capacitor while circumventing this voltage drop, and to do so while avoiding breakdown of the transistor forming the circuit breaker.

This is the reason why a particularly advantageous embodiment of the invention, which may be embodied with the one-input variant or with the two-input variant (differential mode) makes provision to arrange upstream of the precharging capacitor, a driven overvoltage device. More precisely, according to this embodiment, the first circuit breaker comprises two insulated-gate field-effect transistors (which are here dubbed auxiliary transistors), connected in parallel. The gate of a first auxiliary transistor is linked to a control terminal able to receive a predetermined control voltage, for example the supply voltage Vdd.

The precharge means then comprise an auxiliary voltage source embodied for example by two diode-mounted MOS transistors, delivering an auxiliary voltage, for example a voltage equal to Vdd/2. The precharge means moreover comprise a fifth circuit breaker connected between the gate of the second auxiliary transistor and the auxiliary voltage source. They also comprise an auxiliary capacitor connected in series with delay means (formed for example of two inverters) between the gate of the second auxiliary transistor and the control terminal.

The precharge means also comprise fourth drive means able to close the fifth circuit breaker during each off half-period so as to apply the auxiliary voltage to the gate of the second auxiliary transistor, and consequently to charge the auxiliary capacitor. The first drive means are then able to open the fifth circuit breaker for the precharge duration so as to apply to the gate of the second auxiliary transistor a gate voltage delayed with respect to the control voltage and equal to the sum of the control voltage and of the auxiliary voltage, this sum nevertheless having to remain less than the technological maximum voltage. Moreover, of course, this sum must also be greater than the sum of the supply voltage and of the threshold voltage of a transistor, so as to effectively precharge the precharging capacitor with the supply voltage.

BRIEF DESCRIPTION OF THE DRAWINGS

Other characteristics and advantages of the invention will become apparent on examining the detailed description of modes of implementation and embodiments, which are in non-limiting, and of the appended drawings in which.

DETAILED DESCRIPTION OF THE PREFERRED EMBODIMENTS

Figure 1:
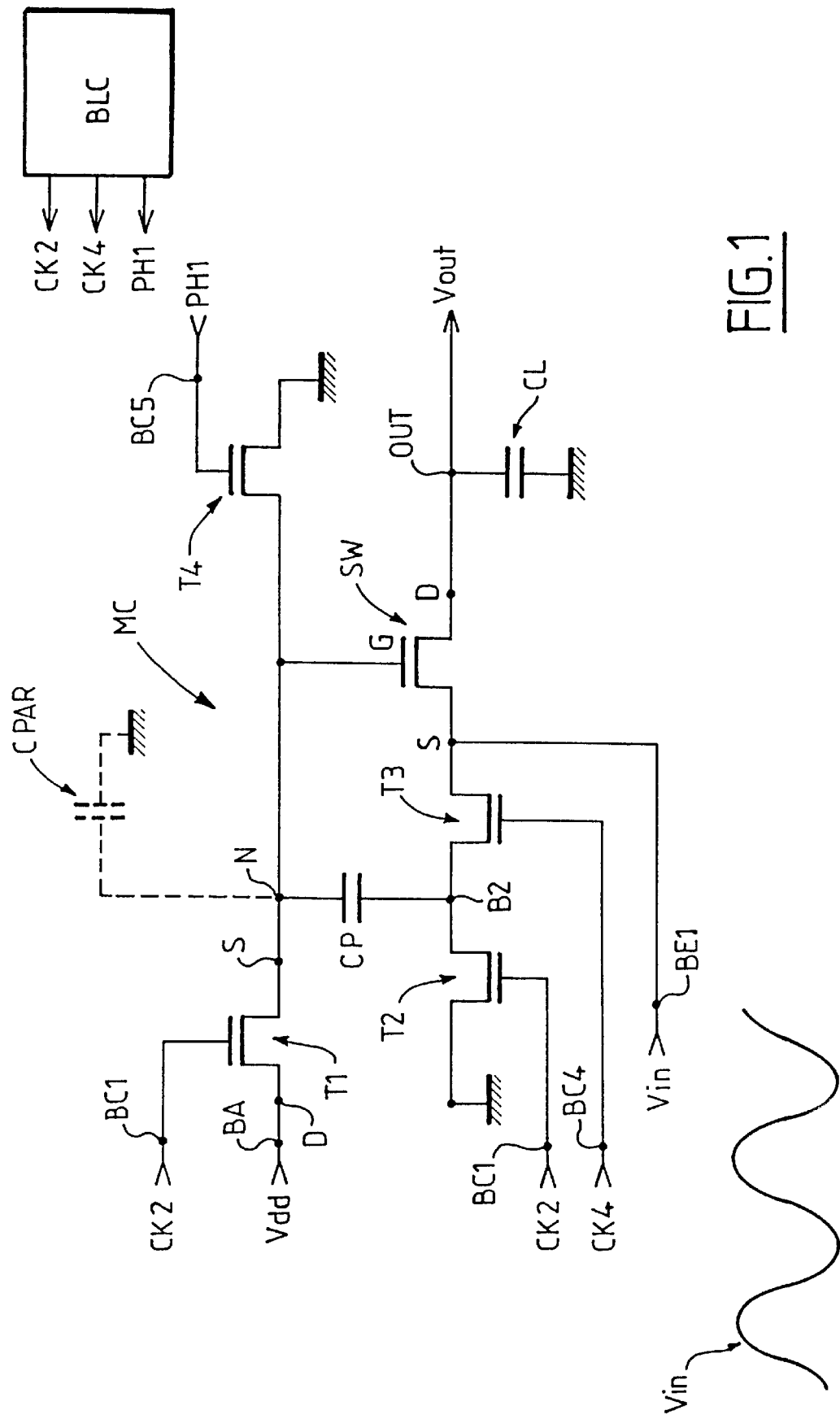
FIG. 1 diagrammatically illustrates a first embodiment of a device according to the invention.

In FIG. 1, the reference CL denotes a switched load capacitance connected between ground and the drain D of a switch SW here formed of an N-channel MOS transistor. The source S of this transistor SW forms a first input terminal BE1 of the switched-capacitance device, which terminal is intended to receive an analog input signal Vin. The drain of the transistor SW forms the output terminal OUT of the switched-capacitance device delivering the output signal Vout.

Control means MC, the structure and the functionality of which will now be described in greater detail, will turn the transistor SW successively on and off. These control means MC include a precharging capacitor CP, of which a first terminal N is linked to a supply terminal BA connected to the supply voltage Vdd by way of a first circuit breaker T1 formed of an MOS transistor. The gate of this transistor T1 forms a first control terminal BC1 which receives a control voltage CK2 emitted by a drive block BLC.

The second terminal B2 of the precharging capacitor CP is grounded by way of a second circuit breaker T2, likewise formed of an MOS transistor whose gate is likewise controlled by the signal CK2. The second terminal B2 of the precharging capacitor is moreover connected to the source of the switch SW by a third circuit breaker T3, likewise formed of an MOS transistor whose gate forms another control terminal BC4 receiving another control signal CK4 likewise emitted by the drive block BLC.

The node N is a common node to the first terminal of the precharging capacitor as well as to the gate G of the switch SW. This gate G is likewise grounded by way of a fourth circuit breaker T4 likewise formed of an MOS transistor and whose gate forms another control terminal BC5 receiving another control signal PH1 likewise emitted by the drive block BLC. This block BLC, embodied for example by logic synthesis in the form of logic gates, incorporates the various drive means according to the invention which have been defined above in a functional manner. Lastly, the reference CPAR denotes a stray capacitance (represented dashed in FIG. 1) arranged between the node N and ground, this stray capacitance essentially being a technological routing capacitance.

Figure 2:
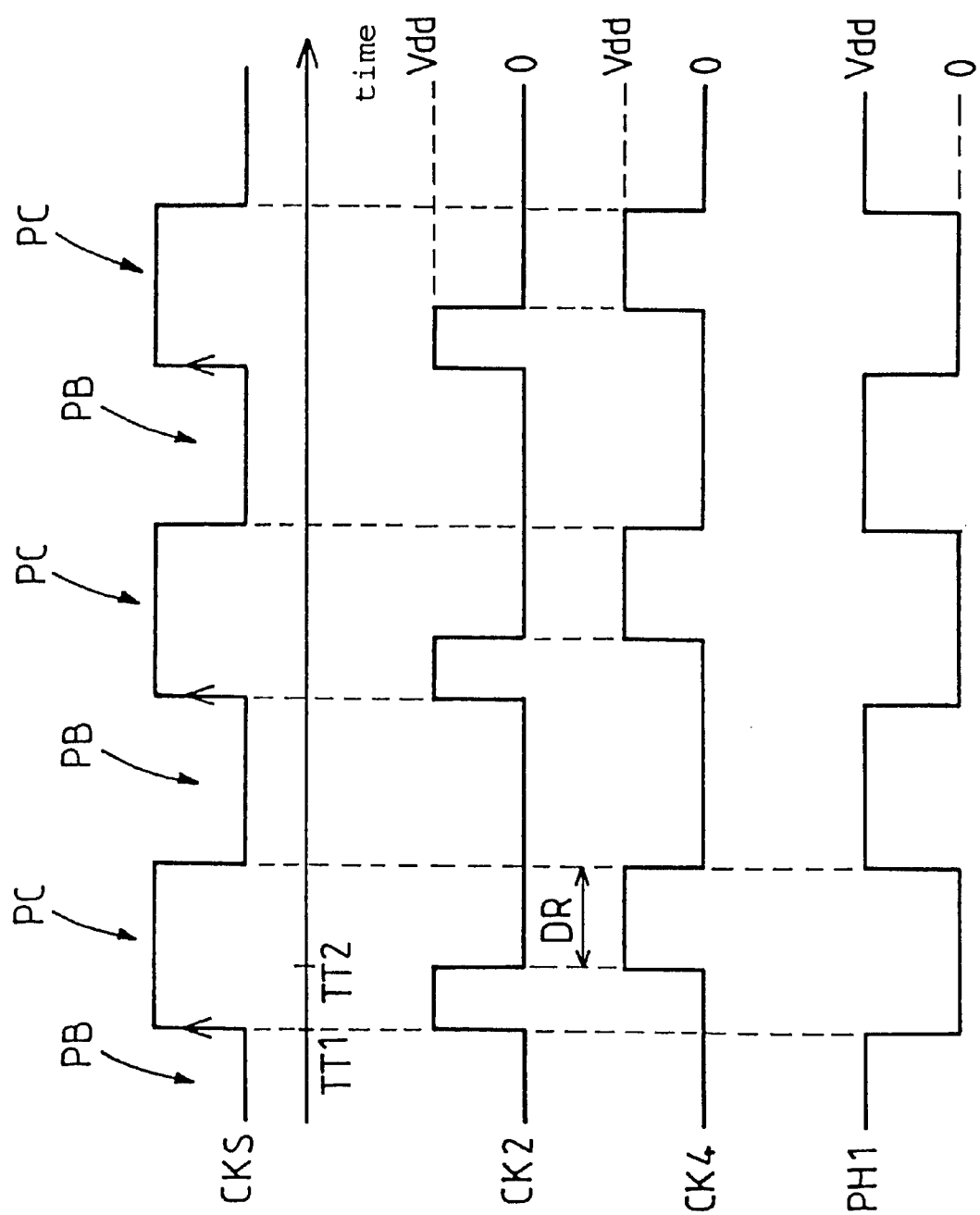
FIG. 2 illustrates a timing chart relating to the operation of the device of FIG. 1 and is representative of a first mode of implementation of the process according to the invention.

Reference is now made more particularly to FIG. 2, to illustrate the manner of operation of the device of FIG. 1. In this FIG. 2, the reference CKS denotes a system clock signal having for example a frequency of 50 MHz and comprising of half-periods PB in the course of which the switch SW is off (switch open), alternating with so-called conduction half-periods PC, in the course of which the control means MC of the device according to the invention will turn the switch SW on (switch closed). The signal CKS is received by the block BLC which formulates the various signals CK2, CK4, PH1.

More precisely, on conclusion of each off half-period PB (instant TT1), the drive block BLC sends the signal CK2 high, this taking the level Vdd for a precharge duration extending up to the instant TT2. For this precharge duration, the signal CK4 remains in the low state (ground, for example) and the signal PH1 which was in the high state falls back to the low state, and will moreover remain so during the entire conduction half-period PC.

It therefore follows that, in the course of this precharge duration, the transistors T1 and T2 are in their on state, and the transistor T3 is off as is the transistor T4. The precharging capacitor CP is therefore charged with the precharge voltage V equal to Vdd−Vt where Vt denotes the threshold voltage of the transistor T1. At time TT2, i.e. on the conclusion of the precharge duration, the signal CK2 falls back to the low state and the signal CK4 rises to the high state. Consequently, the circuit breaker T3 is closed, linking the second terminal B2 of the precharging capacitor to the source. The transistors T1 and T2 are then off and the precharging capacitor is then connected floating between the source S of the switch SW and the gate of this same switch. The voltage Vin of the input signal is applied to the source S and, simultaneously, the precharge voltage V plus the voltage Vin are applied to the gate of the switch SW. It is assumed that the precharge duration has been sufficient to charge the precharging capacitor CP.

Consequently, the gate-source voltage difference $V_{GS}$ of the switch SW is then equal to the precharge voltage V (endowed with a charge redistribution coefficient by reason of the presence of stray capacitance) and is consequently almost independent of the input signal Vin (to within the charge redistribution coefficient). The resistance $R_{on}$ of the switch SW is therefore almost independent of the variations in the input signal Vin. This situation remains identical for the remaining duration DR of the half-period PC on completion of which the signal CK4 reverts to the zero state, while the signal PH1 rises to the high state, this having the consequence of closing the circuit breaker T4 and consequently of grounding the gate G of the switch W and hence of instantaneously turning off the transistor SW, and doing so even if the precharged capacitor remains connected to the gate G. The cycle just described recommences at each half-period PC.

The remaining duration DR must be sufficiently long for the device to be regarded as static in relation to the time constant $R_{on}$ C1, where C1 denotes the capacitive value of the switched capacitance CL. The person skilled in the art will be able to tailor this duration DR as a function of the allowable distortion factor and consequently of the sought-after results. This being so, a duration DR at least equal to three or four times this time constant gives satisfactory results and makes it possible to obtain a resolution of from 10 to 12 bits with input signal frequencies of the order of a few hundred MHz with no appreciable distortion.

By way of indication, if the resistance $R_{on}$ is equal to 50 Ohms and if the capacitive value of the switched capacitance CL has a value of the order of 300 $10^{-15}$ F, the time constant τ is then equal to 15 picoseconds. Considering by way of indication a signal CKS having a frequency of the order of 50 MHz therefore leading to a half-period PC equal to 10 ns, we obtain, if the precharge duration is of the order of from 1 to 2 ns, 8 ns for the remaining duration DR, this being much greater than the time constant of 15 picoseconds.

During the redistribution of the charges at the instant TT2, the gate-source voltage is equal to the voltage Vr given by formula (I):

$$Vr = V - Vin\left[\frac{Cp + Cg}{C + Cg + Cp}\right] \qquad (I)$$

In this formula, V denotes the precharge voltage (Vdd−Vt in this instance), C denotes the capacitive value of the precharging capacitor, Cp denotes the capacitive value of the stray capacitance CPAR and Cg denotes the capacitive value of the gate-source capacitance of the switch SW.

It is therefore apparant that this voltage Vr is lower than the precharge voltage V. In any event, it is necessary for this voltage Vr to be greater than or equal to the threshold voltage of the switch SW so that the latter is on. Consequently, it is necessary for the precharge voltage itself to be greater than the threshold voltage. The person skilled in the art will be able to tailor the value of this precharge voltage, given the characteristics of the device.

By way of indication, a precharge voltage V at least equal to twice the threshold voltage Vt makes it possible to obtain a suitable result. In this instance, the precharge voltage is equal to Vdd−Vt, which is to say around 1.2 volts for a 0.18 micron technology (Vdd=1.8 volts and Vt of the order of 0.5 to 0.6 volts). Moreover, the formula (I) shows that, in order to again minimize the effects of the variations in the input signal Vin, it is preferable for the capacitance C to be much greater than the sum of the capacitance Cg and Cp, for example at least twice or three times greater.

Figure 3:
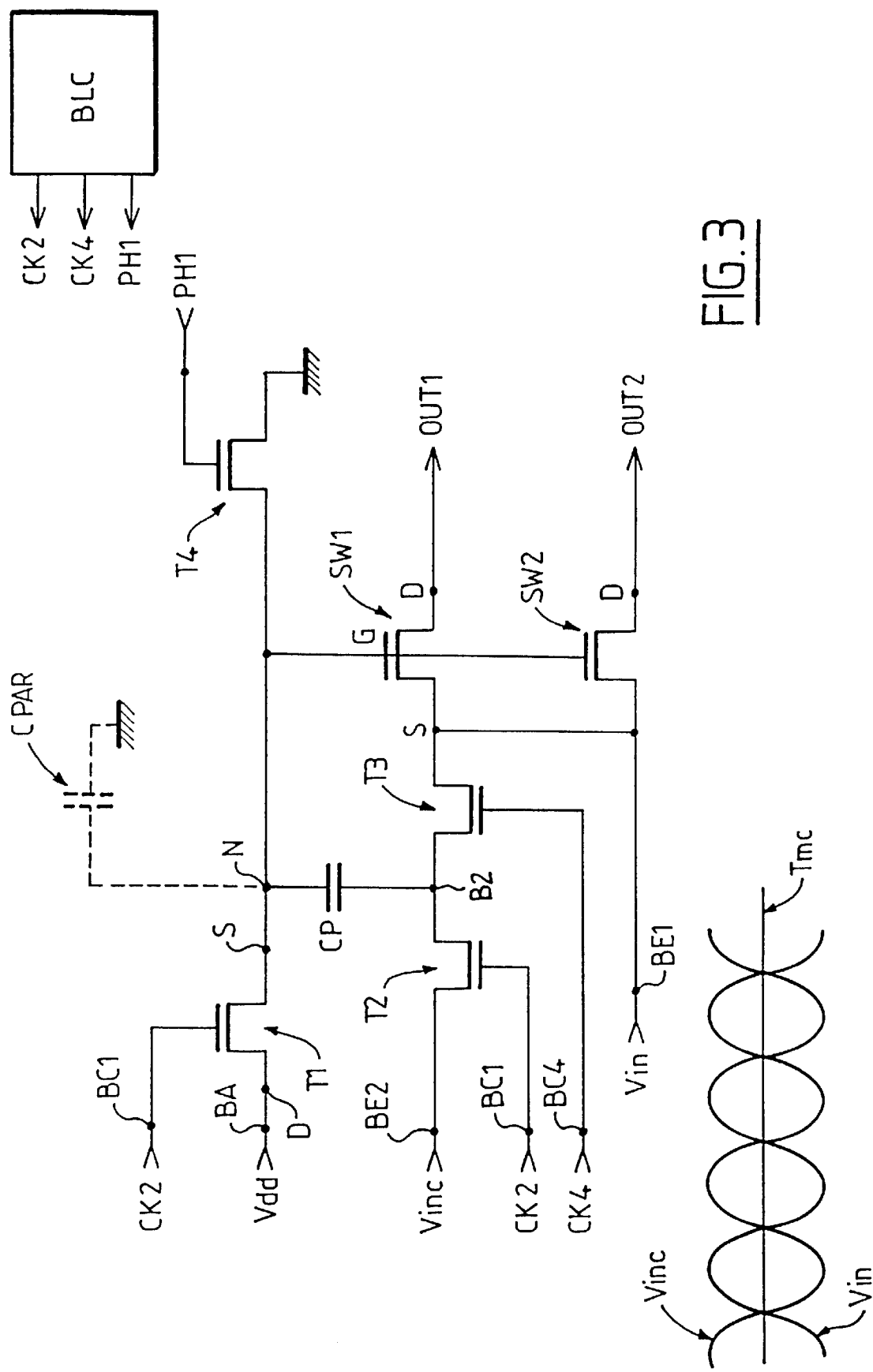
FIG. 3 diagrammatically illustrates another embodiment of a device according to the invention.

The differential setup as illustrated in FIG. 3 makes it possible to compensate for this effect (at the instant TT2) of the stray capacitance at the node N by modulating the precharge voltage via the complemented input. More precisely, the device of FIG. 3 is distinguished from that of FIG. 1 by comprising, in addition to the first input terminal BE1, a second input terminal BE2 linked to the transistor T2. Moreover, the switch is here composed of two MOS transistors, SW1 and SW2, whose sources are linked together and whose gates are likewise linked together and controlled together.

The respective drains of the transistors SW1 and SW2 form the two outputs OUT1 and OUT2 of the device. The input signal (illustrated in the bottom part of FIG. 3) then comprises a direct component Vin and a complemented component Vinc, these two components being symmetrical with respect to a common-mode voltage Tmc. By way of indication, this common-mode voltage Tmc can be equal to 0.5 volts and the signal Vin can vary between 0 and 1 volt. During the precharge duration, the precharge voltage V is equal to Vdd−Vt−Vinc. At the instant TT2, i.e. during redistribution of the charges, the voltage Vr, i.e. the gate-source voltage, is then given by the formula (II):

$$Vr = Vdd - Vt - \frac{2 \cdot C \cdot Tmc}{C + Cg + Cp} - Vin \left[ \frac{Cg + Cp - C}{C + Cg + Cp} \right] \quad (II)$$

The person skilled in the art will therefore note that if the capacitive value C of the precharging capacitor is equal to Cp+Cg, the effect of the stray capacitances which were mentioned hereinabove in respect of the embodiment of FIG. 1, is cancelled out. This being so, regardless of the mode of embodiment used, simple mode or differential mode, once the redistribution has been performed, there nevertheless remains a stray modulation of the voltage $V_{GS}$ by the input signal, by reason of the stray capacitance Cp. This stray modulation is given by formula (III):

$$\Delta V_{GS} = \Delta Vin \cdot Cp/(C + Cg + Cp) \quad (III)$$

However, this modulation remains very small since the value Cp of the stray capacitance, which is essentially a technological routing capacitance, remains very small relative to the sum C+Cg.

In the embodiments just described, the voltage at the node N, which is also the source of the transistor T1, is limited to the voltage applied to the drain of this transistor T1 minus the threshold voltage Vt of this transistor under the assumption that the voltage CK2 applied to the gate is equal to the drain voltage. Indeed, as soon as the gate-source voltage of this transistor T1 becomes lower than the threshold voltage, the transistor then turns off. It is particularly interesting to be able to precharge the capacitance C with a greater voltage, i.e. by circumventing the voltage drop equal to the threshold voltage Vt of the transistor.

Figure 4:
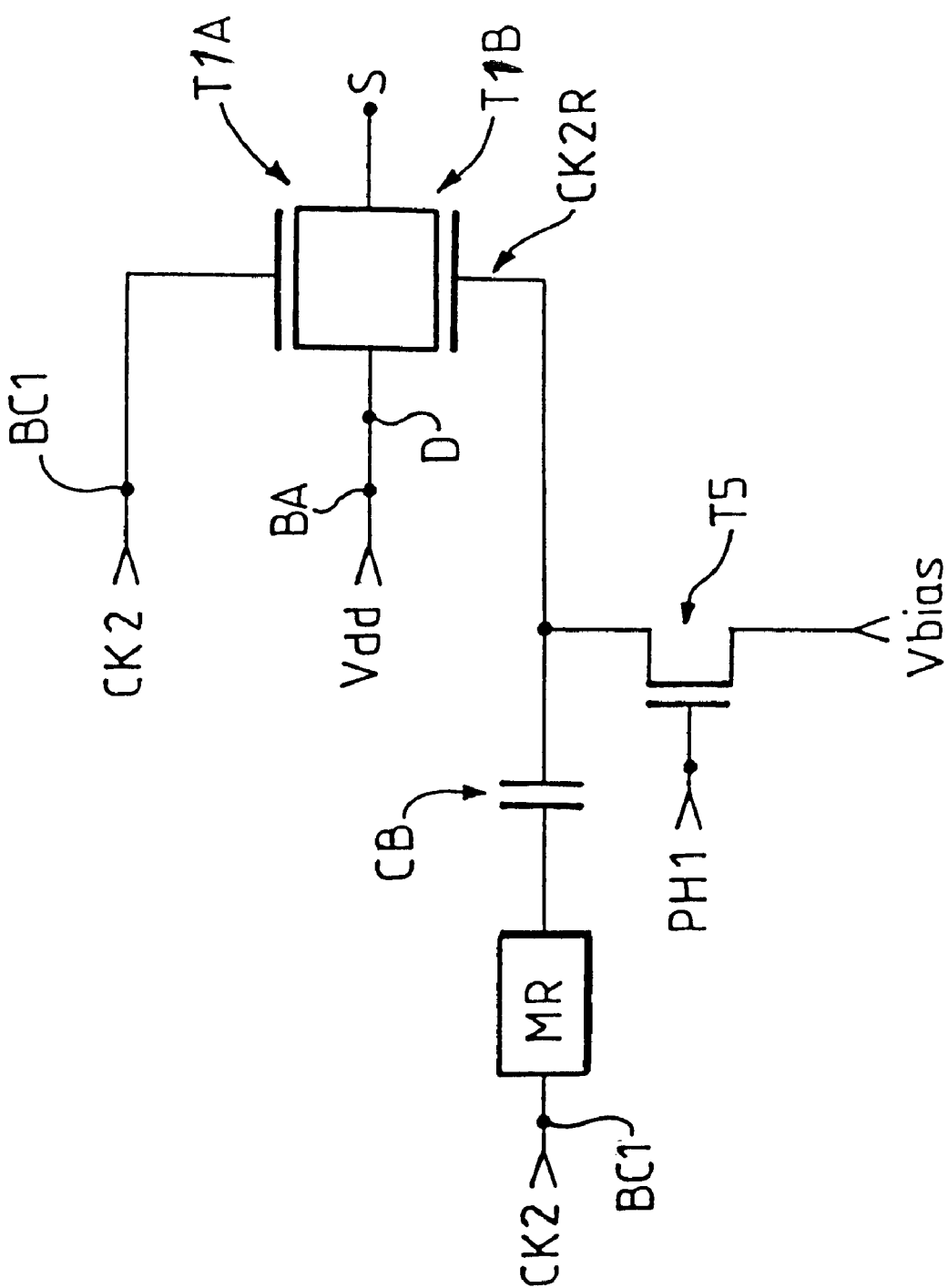
FIG. 4 illustrates in greater detail a driven overvoltage device applicable to one or other of the two above embodiments.

However, if too big a gate voltage is applied, i.e. one which is greater than the supply voltage Vdd, breakdown of the transistor T1 may occur at the instant TT1 when the control voltage Vdd is applied since, at this instant, the drain-source voltage difference is equal to the voltage Vdd. The invention solves this problem by using the driven overvoltage device illustrated in FIG. 4. More precisely, the circuit breaker T1 is here formed of two auxiliary transistors T1A and T1B connected in parallel. The drain of each transistor is connected to the supply terminal BA connected to the supply voltage Vdd. The gate of the auxiliary transistor TA1 receives the signal CK2.

The gate of the other auxiliary transistor T1B is connected to an auxiliary voltage source (not represented here for the sake of simplification) by way of a fifth circuit breaker T5 formed of an MOS transistor controlled on its gate by the signal PH1. The auxiliary voltage source delivers an auxiliary voltage Vbias. The gate of this auxiliary transistor T1B is likewise linked to the control terminal BC1 receiving the signal CK2, by way of an auxiliary capacitor CB and of delay means MR formed for example of two inverters connected in series.

The person skilled in the art will therefore note that, by reason of the presence of the delay means MR, the control signal CK2R controlling the gate of the auxiliary transistor T1B is a signal which is delayed relative to the signal CK2 controlling the gate of the transistor T1A, this delay being for example of the order of 500 picoseconds to 1 ns.

Figure 5:
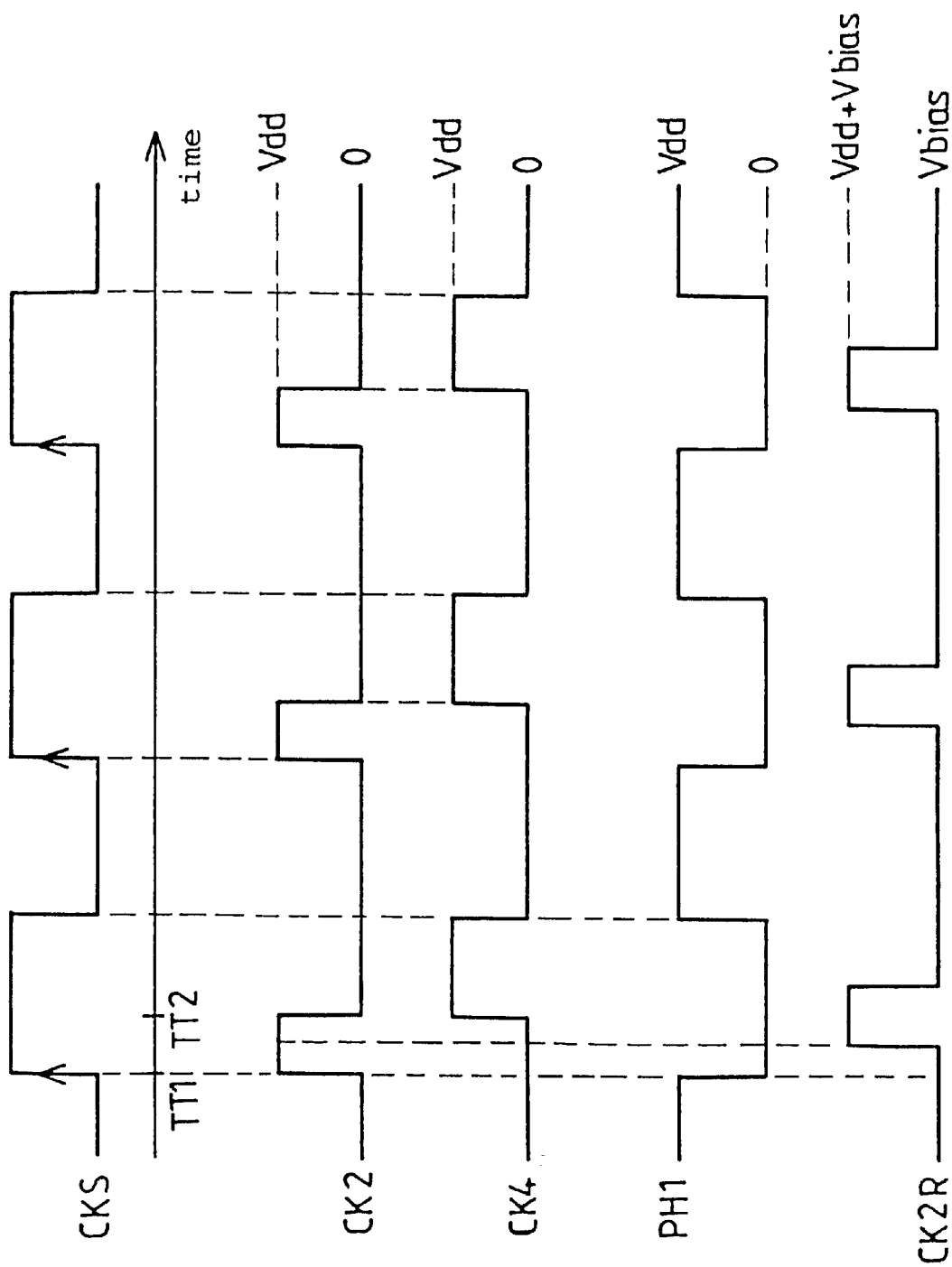
FIG. 5 illustrates a timing chart showing the operation of the driven overvoltage device.

Referring more particularly to FIG. 5, it is apparent that during each off half-period PB, the transistor T5 is closed, thus causing the charging of the capacitor CB with the auxiliary voltage Vbias. At the instant TT1, the breaker T5 is open. The auxiliary transistor TA1 turns on and the auxiliary transistor T1B whose gate control voltage is then equal to Vbias (greater than Vt) is slightly on. When the signal CK2R goes high, its level becomes equal to Vdd+Vbias. This being so, no breakdown of the transistor occurs since at this instant the drain-source voltage difference of the auxiliary transistor T1B is lower than the supply voltage Vdd. Therefore, the voltage at the source S can reach Vdd+Vbias−Vt, i.e. the voltage Vdd if the voltage Vbias is chosen equal to Vt.

That which is claimed:

1. A method of controlling a switch of a switched-capacitance device, the switch comprising at least one insulated-gate field-effect transistor, the method comprising:

delivering an analog input signal on a source of the transistor;

controlling the transistor on its gate, synchronous with a clock signal, to successively turn it on and off, the clock signal having first half-periods during which the transistor is off, and second half-periods during which the transistor is on;

precharging a precharging capacitor with a predetermined precharge voltage after each first half-period of the clock signal and at the start of the second half-period, and for a predetermined precharge duration of the second half-period;

connecting the precharging capacitor between the source and the gate of the transistor for a remaining duration of the second half-period, to turn the transistor on under a gate-source voltage which is substantially independent of a level of the analog input signal; and applying a reference potential to the gate of the transistor and the precharging capacitor at an end of the second half-period.

2. A method according to claim 1, wherein the reference potential is ground.

3. A method according to claim 1, wherein the remaining duration of the second half-period is at least equal to between about 1.5 to 4 times a time constant of a resistive capacitive circuit formed by a drain-source resistance of the transistor while on and by the switched capacitance device; and wherein the value of the precharge voltage is at least equal to 2 times a threshold voltage of the transistor.

4. A method according to claim 1, further comprising, during the precharge duration, applying the precharge voltage to a first terminal of the precharging capacitor while connecting the first terminal of the precharging capacitor to the gate of the transistor, and connecting a second terminal of the precharging capacitor to ground; wherein during the remaining duration of the second half-period, the second terminal of the precharging capacitor is disconnected from ground and is connected to the source of the transistor, and the precharge voltage is not applied to the first terminal of the precharging capacitor.

5. A method according to claim 1, wherein the analog input signal comprises a direct component and a complemented component which are symmetrical with respect to a common-mode voltage; wherein the switch comprises two insulated-gate field-effect transistors whose sources are connected and whose gates are connected; wherein the direct component is delivered on the source of each transistor, and, for the precharge duration, a first terminal of the precharging capacitor receives a supply voltage and is connected to the gate of each transistor; wherein the complemented component is delivered to a second terminal of the precharging capacitor, and, for the remaining duration of the second half-period, the second terminal of the precharging capacitor does not receive the complemented component and is connected to the source of each transistor, and the first terminal of the precharging capacitor does not receive the supply voltage; and wherein a capacitive value of the precharging capacitor is equal to the sum of the capacitive value of a gate-source capacitance of each transistor and of a capacitive value of a stray capacitance existing between the first terminal of the precharging capacitor and ground.

6. A method of controlling a switched-capacitance device having a switch comprising at least one transistor, the method comprising:

providing an analog input signal on a source of the transistor;

generating a clock signal having first half-periods and second half-periods to control the transistor to successively turn it on and off;

providing a predetermined precharge voltage to precharge a precharging capacitor after each first half-period of the clock signal and for a predetermined precharge duration of the second half-period; and turning the transistor on under a gate-source voltage which is substantially independent of a level of the analog input signal by connecting the precharging capacitor between the source and the gate of the transistor for a remaining duration of the second half-period.

7. A method according to claim 6, further comprising applying a reference potential to the gate of the transistor and the precharging capacitor at an end of the second half-period.

8. A method according to claim 6, wherein the reference potential is ground.

9. A method according to claim 6, wherein the remaining duration of the second half-period is at least equal to between about 1.5 to 4 times a time constant of a resistive capacitive circuit formed by a drain-source resistance of the transistor while on and by the switched capacitance device; and wherein the value of the precharge voltage is at least equal to 2 times a threshold voltage of the t resistor.

10. A method according to claim 6, further comprising:

during the precharge duration, applying the precharge voltage to a first terminal of the precharging capacitor while connecting the first terminal of the precharging capacitor to the gate of the transistor, and connecting a second terminal of the precharging capacitor to ground; and during the remaining duration of the second half-period, disconnecting the second terminal of the precharging capacitor from ground, and connecting the second terminal to the source of the transistor, wherein the precharge voltage is not applied to the first terminal of the precharging capacitor.

11. A method according to claim 6, wherein the analog input signal comprises a direct component and a complemented component which are symmetrical with respect to a common-mode voltage; wherein the switch comprises two insulated-gate field-effect transistors whose sources are connected and whose gates are connected; wherein the direct component is delivered on the source of each transistor, and, for the precharge duration, a first terminal of the precharging capacitor receives a supply voltage and is connected to the gate of each transistor; wherein the complemented component is delivered to a second terminal of the precharging capacitor, and, for the remaining duration of the second half-period, the second terminal of the precharging capacitor does not receive the complemented component and is connected to the source of each transistor, and the first terminal of the precharging capacitor does not receive the supply voltage; and wherein a capacitive value of the precharging capacitor is equal to the sum of the capacitive value of a gate-source capacitance of each transistor and of a capacitive value of a stray capacitance existing between the first terminal of the precharging capacitor and ground.

12. A switched-capacitance device, comprising:

at least one input terminal for receiving an analog input signal;

a switch comprising at least one insulated-gate field-effect transistor having a source connected to the input terminal;

a load capacitance connected to a drain of the transistor; and a controller for controlling the transistor on its gate, synchronous with a clock signal, to turn the transistor successively on and off, the controller comprising a precharging capacitor, and a precharge circuit for, after each first half-period of the clock signal during which the transistor is off, precharging the precharging capacitor at a start of a second half-period and for a predetermined precharge duration of the second half-period, with a predetermined precharge voltage, the precharge circuit including a first connection circuit for connecting the precharging capacitor between the source and the gate of the transistor to turn the transistor on under a gate-source voltage which is substantially independent of a level of the analog input signal, during a remaining duration of the second half-period.

13. A device according to claim 12, wherein the precharge circuit further comprises a second connection circuit for applying a reference potential to the gate of the transistor and the precharging capacitor at an end of the second half-period.

14. A device according to claim 12, wherein the reference potential is ground.

15. A device according to claim 12, wherein the remaining duration of the second half-period is at least equal to between about 1.5 to 4 times a time constant of a resistive capacitive circuit formed by a drain-source resistance of the transistor while on and by the switched capacitance device; and wherein the value of the precharge voltage is at least equal to 2 times a threshold voltage of the transistor.

16. A device according to claim 12, wherein the precharge circuit comprises:

a voltage supply terminal;

a first circuit breaker connected between the voltage supply terminal and a first terminal of the precharging capacitor which is connected to the gate of the transistor;

a second circuit breaker connected between ground and a second terminal of the precharging capacitor;

a third circuit breaker connected between the second terminal of the precharging capacitor and the source of the transistor;

a fourth circuit breaker connected between the gate of the transistor and ground; and a drive unit for driving the first, second, third and fourth circuit breakers, the drive unit closing the first and second circuit breakers and opening the third and fourth circuit breakers for the precharge duration;

the third circuit breaker and the drive unit defining the first connection circuit which opens the first, second and fourth circuit breakers and closes the third circuit breaker for the remaining duration of the second half-period; and the fourth circuit breaker and the drive unit defining the second connection circuit which closes the fourth circuit breaker at the end of the second half-period.

17. A device according to claim 16, wherein a capacitive value of the precharging capacitor is at least three times greater than the sum of a capacitive value of the gate-source capacitance of the transistor and of a capacitive value of a stray capacitance existing between the first terminal of the precharging capacitor and ground.

18. A device according to claim 16, wherein the first circuit breaker comprises two auxiliary insulated-gate field-effect transistors connected in parallel, a gate of the first auxiliary transistor receiving a control voltage; wherein the precharge circuit comprises:

an auxiliary voltage source delivering an auxiliary voltage;

a fifth circuit breaker connected between the gate of the second auxiliary transistor and the auxiliary voltage source;

an auxiliary capacitor and delay unit connected in series and to the gate of the second auxiliary transistor, and receiving the control voltage; and the drive unit closing the fifth circuit breaker for each first half-period to apply the auxiliary voltage to the gate of the second auxiliary transistor, and opening the fifth circuit breaker for the precharge duration to apply to the gate of the second auxiliary transistor a gate voltage delayed with respect to the control voltage and equal to the sum of the control voltage and the auxiliary voltage.

19. A device according to claim 12, wherein the input signal comprises a direct component and a complemented component which are symmetrical with respect to a common-mode voltage; wherein the at least one input terminal comprises a first input terminal receiving the direct component of the input signal and a second input terminal receiving the complemented component of the input signal; wherein the switch comprises two insulated-gate field-effect transistors having sources connected together and to the first input terminal, and having gates connected together; wherein the precharge circuit comprises:

a first voltage supply terminal;

a first circuit breaker connected between the first voltage supply terminal and a first terminal of the precharging capacitor which is connected to the gate of each transistor;

a second circuit breaker connected between the second input terminal receiving the complemented component of the analog input signal and a second terminal of the precharging capacitor;

a third circuit breaker connected between the second terminal of the precharging capacitor and the source of each transistor;

a fourth circuit breaker connected between the gate of each transistor and ground; and a drive unit for driving the first, second, third and fourth circuit breakers, the drive unit closing the first and second circuit breakers and opening the third and fourth circuit breakers for the precharge duration;

the third circuit breaker and the drive unit defining the first connection circuit which opens the first, second and fourth circuit breakers and closes the third circuit breaker for the remaining duration of the second half-period;

the fourth circuit breaker and the drive unit defining the second connection circuit which closes the fourth circuit breaker at the end of the second half-period; and wherein a capacitive value of the precharging capacitor is substantially equal to the sum of a capacitive value of the gate-source capacitance of each transistor and of a capacitive value of a stray capacitance existing between the first terminal of the precharging capacitor and ground.

20. A device according to claim 19, wherein the first circuit breaker comprises two auxiliary insulated-gate field-effect transistors connected in parallel, a gate of the first auxiliary transistor receiving a control voltage; wherein the precharge circuit comprises:

an auxiliary voltage source delivering an auxiliary voltage;

a fifth circuit breaker connected between the gate of the second auxiliary transistor and the auxiliary voltage source;

an auxiliary capacitor and delay unit connected in series and to the gate of the second auxiliary transistor, and receiving the control voltage; and the drive unit closing the fifth circuit breaker for each first half-period to apply the auxiliary voltage to the gate of the second auxiliary transistor, and opening the fifth circuit breaker for the precharge duration to apply to the gate of the second auxiliary transistor a gate voltage delayed with respect to the control voltage and equal to the sum of the control voltage and the auxiliary voltage.

21. A switched-capacitance device, comprising:

at least one input terminal for receiving an analog input signal;

a switch comprising at least one insulated-gate field-effect transistor having a source connected to the input terminal;

a load capacitor connected to a drain of the transistor; and a controller for controlling the transistor synchronously with a clock signal, the clock signal having a first half-period during which the transistor is off, and a second half-period during which the transistor is on, the controller comprising a precharging capacitor, and a precharge circuit for precharging the precharging capacitor with a predetermined precharge voltage for a predetermined precharge duration of the second half-period, the precharge circuit including a first connection circuit for connecting the precharging capacitor between the source and the gate of the transistor to turn the transistor on under a gate-source voltage which is substantially independent of a level of the analog input signal, during a remaining duration of the second half-period.

22. A device according to claim 21, wherein the precharge circuit further comprises a second connection circuit for applying a reference potential to the gate of the transistor and the precharging capacitor at an end of the second half-period.

23. A device according to claim 21, wherein the reference potential is ground.

24. A device according to claim 21, wherein the remaining duration of the second half-period is at least equal to between about 1.5 to 4 times a time constant of a resistive capacitive circuit formed by a drain-source resistance of the transistor while on and by the switched capacitance device; and wherein the value of the precharge voltage is at least equal to 2 times a threshold voltage of the transistor.

25. A device according to claim 21, wherein the precharge circuit comprises:

a voltage supply terminal;

a first switch connected between the voltage supply terminal and a first terminal of the precharging capacitor which is connected to the gate of the transistor;

a second switch connected between ground and a second terminal of the precharging capacitor;

a third switch connected between the second terminal of the precharging capacitor and the source of the transistor;

a fourth switch connected between the gate of the transistor and ground; and a drive unit for driving the first, second, third and fourth switches, the drive unit closing the first and second switches and opening the third and fourth switches for the precharge duration;

the third switch and the drive unit defining the first connection circuit which opens the first, second and fourth switches and closes the third switch for the remaining duration of the second half-period; and the fourth switch and the drive unit defining the second connection circuit which closes the fourth switch at the end of the second half-period.

26. A device according to claim 25, wherein a capacitive value of the precharging capacitor is at least three times greater than the sum of a capacitive value of the gate-source capacitance of the transistor and of a capacitive value of a stray capacitance existing between the first terminal of the precharging capacitor and ground.

27. A device according to claim 25, wherein the first switch comprises two auxiliary insulated-gate field-effect transistors connected in parallel, a gate of the first auxiliary transistor receiving a control voltage; wherein the precharge circuit further comprises:

an auxiliary voltage source delivering an auxiliary voltage;

a fifth switch connected between the gate of the second auxiliary transistor and the auxiliary voltage source; and an auxiliary capacitor and delay unit connected in series and to the gate of the second auxiliary transistor, and receiving the control voltage;

the drive unit closing the fifth switch for each first half-period to apply the auxiliary voltage to the gate of the second auxiliary transistor, and opening the fifth switch for the precharge duration to apply to the gate of the second auxiliary transistor a gate voltage delayed with respect to the control voltage and equal to the sum of the control voltage and the auxiliary voltage.

28. A device according to claim 21, wherein the input signal comprises a direct component and a complemented component which are symmetrical with respect to a common-mode voltage; wherein the at least one input terminal comprises a first input terminal receiving the direct component of the input signal and a second input terminal receiving the complemented component of the input signal; wherein the switch comprises two insulated-gate field-effect transistors having sources connected together and to the first input terminal, and having gates connected together; wherein the precharge circuit comprises:

a first voltage supply terminal;

a first switch connected between the first voltage supply terminal and a first terminal of the precharging capacitor which is connected to the gate of each transistor;

a second switch connected between the second input terminal receiving the complemented component of the analog input signal and a second terminal of the precharging capacitor;

a third switch connected between the second terminal of the precharging capacitor and the source of each transistor;

a fourth switch connected between the gate of each transistor and ground; and a drive unit for driving the first, second, third and fourth switches, the drive unit closing the first and second switches and opening the third and fourth switches for the precharge duration;

the third switch and the drive unit defining the first connection circuit which opens the first, second and fourth switches and closes the third switch for the remaining duration of the second half-period;

the fourth switch and the drive unit defining the second connection circuit which closes the fourth switch at the end of the second half-period; and wherein a capacitive value of the precharging capacitor is substantially equal to the sum of a capacitive value of the gate-source capacitance of each transistor and of a capacitive value of a stray capacitance existing between the first terminal of the precharging capacitor and ground.

29. A device according to claim 28, wherein the first switch comprises two auxiliary insulated-gate field-effect transistors connected in parallel, a gate of the first auxiliary transistor receiving a control voltage; wherein the precharge circuit further comprises:

an auxiliary voltage source delivering an auxiliary voltage;

a fifth switch connected between the gate of the second auxiliary transistor and the auxiliary voltage source;

an auxiliary capacitor and delay unit connected in series and to the gate of the second auxiliary transistor, and receiving the control voltage; and the drive unit closing the fifth switch for each first half-period to apply the auxiliary voltage to the gate of the second auxiliary transistor, and opening the fifth switch for the precharge duration to apply to the gate of the second auxiliary transistor a gate voltage delayed with respect to the control voltage and equal to the sum of the control voltage and the auxiliary voltage.

* * * * *

UNITED STATES PATENT AND TRADEMARK OFFICE
CERTIFICATE OF CORRECTION

PATENT NO.   : 6,249,154 B1
DATED        : June 19, 2001
INVENTOR(S)  : Pierre-Olivier Jouffre, Isabelle Telliez, Frederic Paillardet It is certified that error appears in the above-identified patent and that said Letters Patent is hereby corrected as shown below:

<u>Column 11,</u>
Line 45, delete "t resistor." insert -- transistor. --

Signed and Sealed this

Twenty-ninth Day of January, 2002

Attest:

Attesting Officer

JAMES E. ROGAN
*Director of the United States Patent and Trademark Office*